(12) United States Patent
Zhang

(10) Patent No.: US 7,699,638 B2
(45) Date of Patent: Apr. 20, 2010

(54) SOCKET CONNECTOR WITH IMPROVED ELECTRICAL CONTACT

(75) Inventor: Jie-Feng Zhang, Shenzhen (CN)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/538,176

(22) Filed: Aug. 10, 2009

(65) Prior Publication Data
US 2010/0035445 A1 Feb. 11, 2010

(30) Foreign Application Priority Data
Aug. 10, 2008 (CN) .......................... 2008 1 0021702

(51) Int. Cl.
*H01R 4/50* (2006.01)
(52) U.S. Cl. ...................................... 439/342
(58) Field of Classification Search ................. 439/342, 439/135, 259
See application file for complete search history.

(56) References Cited

U.S. PATENT DOCUMENTS

| | | | |
|---|---|---|---|
| 6,074,233 A * | 6/2000 | Lin | 439/342 |
| 6,267,615 B1 | 7/2001 | Lin | |
| 6,471,534 B1 | 10/2002 | Lee | |
| 2004/0009694 A1 * | 1/2004 | Lai | 439/342 |
| 2008/0227324 A1 * | 9/2008 | Cheng et al. | 439/342 |

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

An electrical connector includes an insulative housing (1) and an electrical contact (2) received in the insulative housing. The electrical contact includes a planar main portion (20), a soldering portion (21) extending horizontally from a lower end of the main portion and first and second elastic arms (23, 24) extending from an upper end of the main portion. The first elastic arm has a first connecting portion (232) connecting to the main portion. The second elastic arm has a first curved portion (243) connecting to the main portion, a second curved portion (244) connecting with the first curved portion and a connecting portion (242) vertically extending from the second curved portion. Two contact portions (230, 240) extend respectively and laterally from the first and second connecting portions. A first distance defined between the connecting portions is larger than a second distance defined between the contact portions taken from a side view.

13 Claims, 4 Drawing Sheets

SOCKET CONNECTOR WITH IMPROVED ELECTRICAL CONTACT

BACKGROUND OF THE INVENTION

1. Field of the Invention

The present invention relates generally to a socket connector, and more particularly to a Zero Insertion Force (ZIF) socket connector for electrically interconnecting a Central Processing Unit (CPU) with a Printed Circuit Board (PCB).

2. Description of Related Arts

U.S. Pat. No. 6,267,615 issued to Lin on Jul. 31, 2001 discloses an electrical contact comprising a main portion, a soldering portion, a pair of wing portions extending laterally and forwardly from two edges of the main portion and a pair of contact portions each formed at a free end of the wing portion. However, such kind of electrical contact consumes a large quantity of material in manufacture because the electrical contact takes a large width in a plane view before the wing portions are folded. Therefore, each two adjacent electrical contacts have a larger distance therebetween before the contacts are cut off from the belt. Usually, the adjacent electrical contacts usually have double pitch which is two times of a distance defined between the adjacent passageways of the insulative housing. In an assembling of the electrical contacts into the insulative housing, two or three times are usually needed to insert the same row of electrical contacts, which is rather troublesome and time-using.

U.S. Pat. No. 6,471,534 issued to Lee on Oct. 29, 2002 discloses an electrical contact includes a retention portion, a soldering portion extending from the retention portion, a first arm and a second arm extending upwardly from the retention portion and beside each other. The first arm has a beam section, a curved section and a free end. The second arm includes a leg section and a curved contacting section. The free end and the curved contacting section cooperate with each other to press therebetween and electrically connect with a pin of an electronic package received on the cover. However, the first arm has only one curved section that it makes a cut-off section of the material contacting with the inserted pin of the CPU. The pin of the CPU is easily scraped by the cut-off section because of the cut-off section is rough. After several times of insertion and removal, the pin of the CPU may be damaged and unable to use.

Hence, an electrical connector with a material-saving electrical contact for preventing damage to the pin of the CPU are desired.

SUMMARY OF THE INVENTION

Accordingly, an object of the present invention is to provide an electrical connector with a material-saving electrical contact for preventing damage to the pin of the CPU.

To achieve the above object, an electrical connector includes an insulative housing and an electrical contact received in the insulative housing. The electrical contact includes a planar main portion, a soldering portion extending horizontally from a lower end of the main portion and first and second elastic arms extending from an upper end of the main portion. The first elastic arm has a first connecting portion connecting to the main portion. The second elastic arm has a first curved portion connecting to the main portion, a second curved portion connecting with the first curved portion and a connecting portion vertically extending from the second curved portion. Two contact portions extend respectively and laterally from the first and second connecting portions. A first distance defined between the connecting portions is larger than a second distance defined between the contact portions taken from a side view.

Other objects, advantages and novel features of the invention will become more apparent from the following detailed description when taken in conjunction with the accompanying drawings.

DETAILED DESCRIPTION OF THE PREFERRED EMBODIMENT

Figure 1:
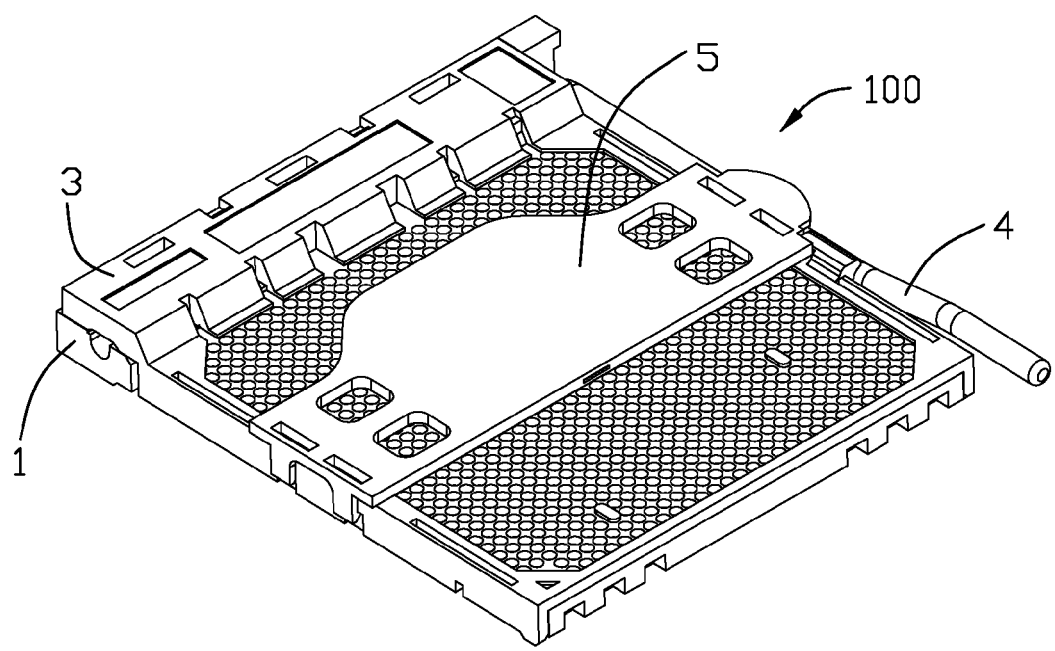
FIG. 1 is a perspective, assembled view of an electrical connector of the present invention.
Figure 2:
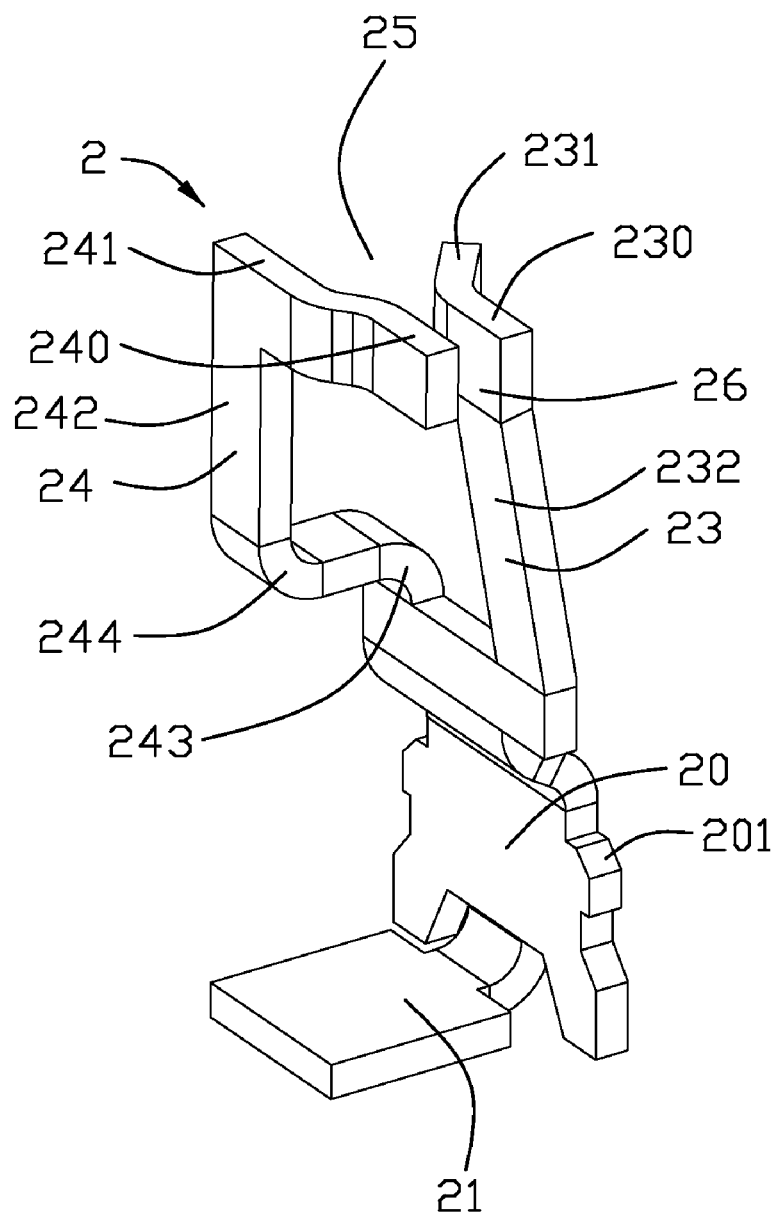
FIG. 2 is a perspective view of an electrical contact according to the present invention.
Figure 3:
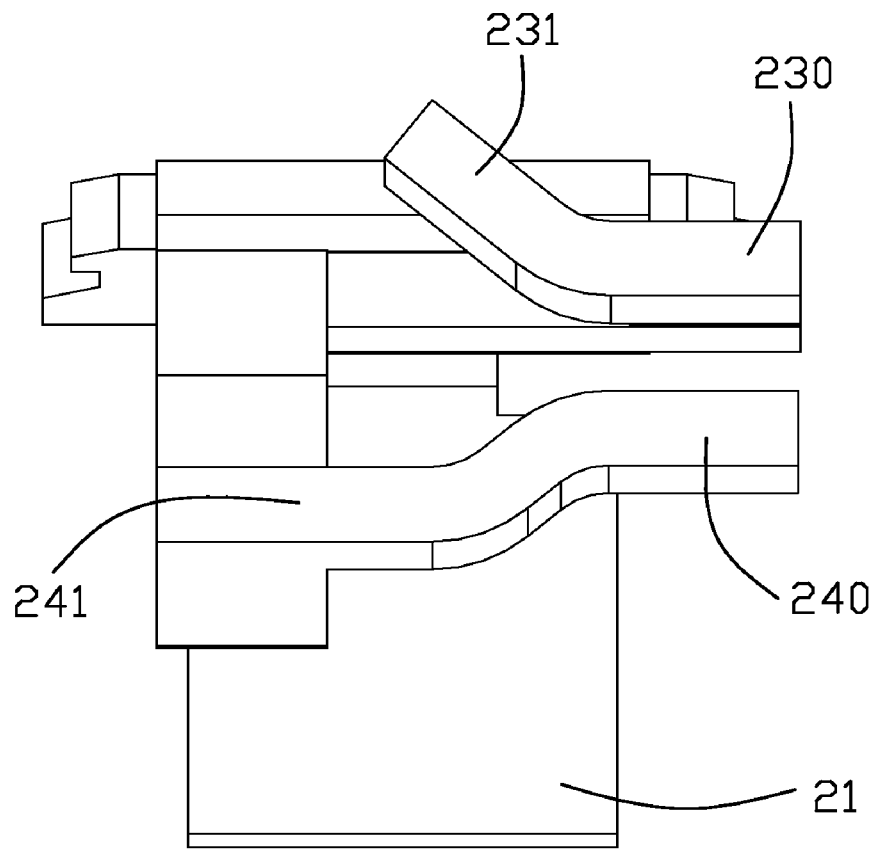
FIG. 3 is a top view of the electrical contact.
Figure 4:
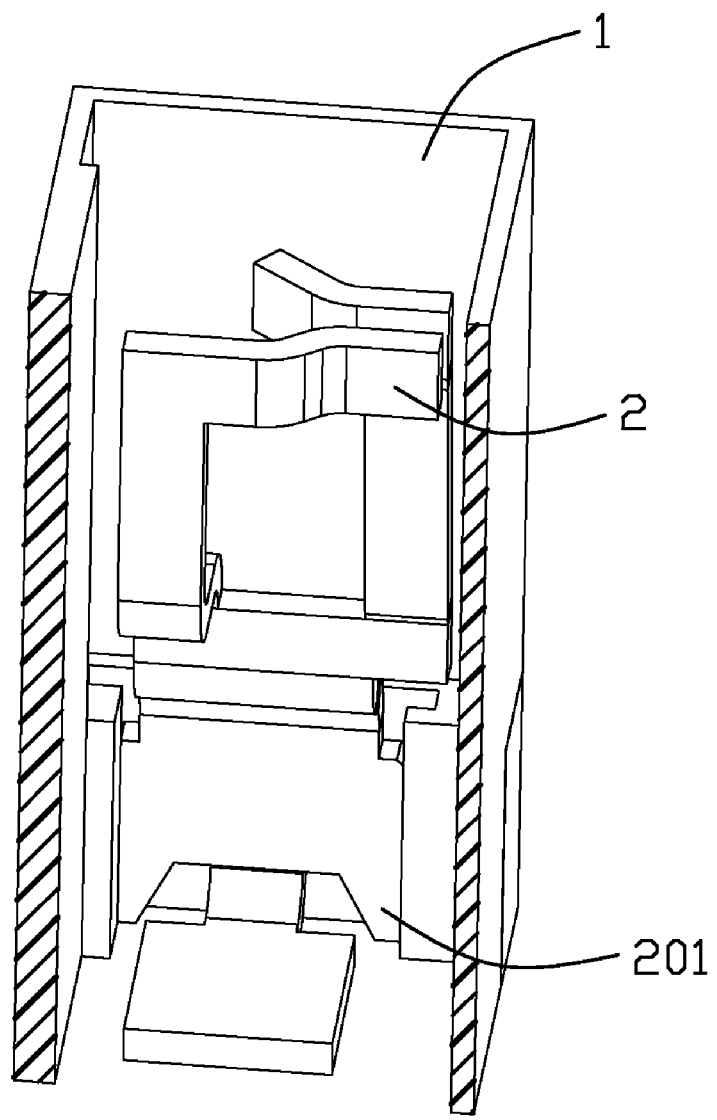
FIG. 4 is a partly cross-section view of the electrical contact securely received in an insulative housing of the electrical connector.

Referring to FIGS. 2 and 3, an electrical contact 2 of the present invention is described as following: the electrical contact 2 comprises a main portion 20, a soldering portion 21 extending horizontally from a lower end of the main portion 20, a first elastic arm 23 and a second elastic arm 24 both extending upwardly from an upper end of the main portion 20. The first elastic arm 23 has a first connecting portion 232 connecting to the main portion 20 and a first contact portion 230 at a top end of the first connecting portion 232. The second elastic arm 24 has a first curved portion 243 connecting to the main portion 20, a second curved portion 244 connecting with the first curved portion 243 and a connecting portion 242 vertically extending from the second curved portion 244. A second guiding portion 241 is formed at a top end of the second curved portion 244. A first guiding portion 231 extends leftward from the first contact portion 230 and outwardly away from the second guiding portion 241. A second contact portion 240 extends rightward from the second guiding portion 241 and extends parallel with the first contact portion 230. Therefore, the first guiding portion 231 cooperates with the second guiding portion 241 to define a first interspace 25 larger than a second interspace 26 defined by the first contact portion 230 and the second contact portion 240. Particularly, a first distance defined between the connecting portions 232, 242 is larger than a second distance defined between the contact portions 230, 240 taken from a side view. Therefore, when a CPU (Central Processing Unit) (not shown) contacts with the electrical contact 2, a pin of the CPU is inserted into the first interspace 25 with zero insertion force and then moves towards the second interspace 26 and at last, the pin of the CPU is sandwiched between the first contact portion 230 and the second contact portion 240. An electrical connection is achieved between the CPU and the electrical contact 2.

The electrical contact 2 takes up smaller room when it is unfolded, because the first elastic arm 23 and the second elastic arm 24 both extend directly and upwardly from the upper end of the main portion 20 instead of extending laterally and forwardly from two edges of the main portion. In the manufacturing, the adjacent electrical contacts 2 has a single pitch and is mateable with a distance defined between the adjacent passageways of an insulative housing 1. The same row of electrical contacts 2 is inserted into the insulative housing 1 at the same time, which is simpler and much more time-saving. Furthermore, because the second elastic arm 24 comprises two curved portions 242, 243 that it provides a smooth surface to contact with the inserted pin of the CPU and prevents a cut-off surface from contacting with the inserted pin of the CPU, which may scrap the pin of the CPU.

Referring to FIGS. 1-4, the electrical contact 2 further comprises a plurality of fixing portions 201 extending from the main portion 20 and the electrical contact 2 is securely received in the insulative housing 1 by the fixing portions 201. Besides the insualtive housing 1 and the electrical contact 2, an electrical connector 100 further comprises a cover 3 covered on the insulative housing 2 and capable of sliding freely relative to the insulative housing 2, a lever 4 arranged between the insulative housing 2 and the cover 3 to drive the cover 3 moving between a first position and a second position and a pick up cap 5 secured to the cover 3 for picking up the electric connector 100 by an automatic device.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector for connecting a Central Processing Unit (CPU) with a printed circuit board (PCB), comprising:
   an insulative housing; and
   an electrical contact received in the insulative housing, comprising:
   a main portion;
   a soldering portion extending horizontally from a lower end of the main portion;
   a first elastic arm and a second elastic arm extending from an upper end of the main portion, the first elastic arm having a first connecting portion connecting to the main portion, the second elastic arm having a first curved portion connecting to the main portion, a second curved portion connecting with the first curved portion and a connecting portion vertically extending from the second curved portion; and
   a first contact portion extending laterally from the first connecting portion and a second contact portion extending laterally from the second connecting portion;
   wherein a first distance defined between the connecting portions is larger than a second distance defined between the contact portions when taken from a side view, wherein the first contact portion is formed at a top end of the first connecting portion and comprises a first guiding portion extending therefrom, wherein the second elastic arm forms a second guiding portion at a top end of the second connecting portion and the second contact portion extends from the second guiding portion, wherein the first and the second guiding portions define a first interspace and the first and the second contact portions define a second interspace smaller than the first interspace, wherein tips ends of the two contact portions extend parallel to each other.

2. The electrical connector as described in claim 1, wherein the electrical contact comprises a plurality of barbs formed along opposite edges of the main portion.

3. The electrical connector as described in claim 1, further comprising a cover shielding the insulative housing and wherein the cover is capable of sliding freely relative to the insulative housing.

4. The electrical connector as described in claim 3, further comprising a lever arranged between the insulative housing and the cover to drive the cover moving between a first position and a second position.

5. The electrical connector as described in claim 3, further comprising a pick up cap secured to the cover for being picked up by an automatic device.

6. An electrical connector comprising:
   an insulative housing defining at least one passageway extending therethrough in a vertical direction;
   at least one contact disposed in the housing, said contact including:
   a main portion retaining said contact to the housing and defining a transverse direction perpendicular to a thickness direction of the main portion;
   a first elastic arm having a first connection portion extending upward from an upper portion of the main body and defining associated first contact portion and first guide portion at a top end thereof;
   a second elastic arm having a second connection portion extending upward from the upper portion of the main body and defining associated second contact portion and second guide portion at a top end thereof under condition that said first connection portion and said second connection portion are spaced from each other in said transverse direction; wherein
   the first contact portion is essentially aligned with the first connection portion in a vertical direction, which is perpendicular to both said transverse direction and said thickness direction, and the associated first guide portion extends from the first contact portion toward the second elastic arm in said transverse direction, while both the second guide portion and the associated contact portion are not aligned with the second connection portion in the vertical direction but extend toward the first elastic arm in said transverse direction under condition that the first contact portion and the second contact portion face to each other in the thickness direction, and the first guide portion and the second guide portion face to each other in said thickness direction wherein a distance between said first guide portion and said second guide portion is larger than that between said first contact portion and said second contact portion, wherein the upper portion of the main body is essentially offset from remainders of the main body in said thickness direction toward said second elastic arm.

7. The electrical connector as claimed in claim 6, wherein said second connection portion curvedly extends away from the first connection portion in said thickness direction.

8. The electrical connector as claimed in claim 7, wherein said first connection portion extends toward the second connection portion slightly obliquely in said thickness direction.

9. The electrical connector as claimed in claim 7, wherein said contact further includes a horizontal solder pad extending from a lower portion of the main body in the thickness direction toward the second connection portion.

10. An electrical connector comprising:
    an insulative housing defining at least one passageway extending therethrough in a vertical direction;
    at least one contact disposed in the housing, said contact including:
    a main portion retaining said contact to the housing and defining a transverse direction perpendicular to a thickness direction of the main portion;
    a first elastic arm and a second elastic arm respectively extending from two opposite positions of an upper portion of the main body, said first elastic arm defining a small 7-like configuration and said second elastic arm defining a large 7 like configuration under condition that said small 7 like configuration and said large 7-like configuration face toward each other, said first elastic arm defining associated first contact portion and first guide portion extending in said transverse direction, and said second elastic arm defines associated second contact portion and second guide portion extending in said transverse direction;

wherein when said contact is in an extended manner on a contact carrier before being bent to a final shape thereof, and said large 7-like configuration defines a space in which said small 7-like configuration is received under condition that the associated second contact portion and second guide portion are higher than the associated first contact portion and first guide portion; and when said contact is bent to the final shape, said associated first contact portion and first guide portion are essentially located at a same level with the associated second contact portion and second guide portion under condition that the first contact portion and the second contact portion face to each other in the thickness direction, and the first guide portion and the second guide portion face to each other in said thickness direction wherein a distance between said first guide portion and said second guide portion is larger than that between said first contact portion and said second contact portion, wherein the upper portion of the main body is essentially offset from remainders of the main body in said thickness direction toward said second elastic arm.

11. The electrical connector as claimed in claim 10, wherein said second connection portion curvedly extends away from the first connection portion in said thickness direction.

12. The electrical connector as claimed in claim 11, wherein said first connection portion extends toward the second connection portion slightly obliquely in said thickness direction.

13. The electrical connector as claimed in claim 11, wherein said contact further includes a horizontal solder pad extending from a lower portion of the main body in the thickness direction toward the second connection portion.

* * * * *